(12) United States Patent
Bergstrom et al.

(10) Patent No.: US 6,948,541 B2
(45) Date of Patent: Sep. 27, 2005

(54) SYSTEM FOR HANDLING COMPONENTS AT A COMPONENT MOUNTING MACHINE

(75) Inventors: Johan Bergstrom, Bromma (SE); Maria Liljegren, Sollentuna (SE); Johan Skaborn, Uppsala (SE)

(73) Assignee: Mydata Automation AB, Bromma (SE)

( * ) Notice: Subject to any disclaimer, the term of this patent is extended or adjusted under 35 U.S.C. 154(b) by 158 days.

(21) Appl. No.: 10/884,940

(22) Filed: Jul. 7, 2004

(65) Prior Publication Data

US 2005/0000650 A1 Jan. 6, 2005

Related U.S. Application Data

(63) Continuation of application No. 10/246,730, filed on Sep. 19, 2002, now Pat. No. 6,773,542.

(30) Foreign Application Priority Data

Sep. 19, 2001 (EP) .............................................. 01850159

(51) Int. Cl.[7] .............................. B32B 35/00; B65H 5/28
(52) U.S. Cl. .......................... 156/584; 156/344; 221/25; 221/72; 221/87; 414/411; 414/416
(58) Field of Search ............................... 221/25, 72, 73, 221/79, 87; 226/120, 139; 414/411, 416, 425; 156/344, 584

(56) References Cited

U.S. PATENT DOCUMENTS

| | | | |
|---|---|---|---|
| 4,768,915 A | | 9/1988 | Fujioka |
| 4,820,369 A | | 4/1989 | Kubo |
| 5,342,474 A | * | 8/1994 | Mohara et al. ............. 156/584 |
| 5,515,600 A | | 5/1996 | Iwasaki et al. |
| 5,762,754 A | * | 6/1998 | Kondo et al. ................ 156/584 |
| 5,975,395 A | * | 11/1999 | Takada et al. ............... 226/162 |
| 6,402,452 B1 | | 6/2002 | Miller et al. |
| 6,619,526 B1 | | 9/2003 | Souder, Jr. |
| 6,631,870 B2 | * | 10/2003 | Bergstrom ................... 242/615 |
| 2002/0014002 A1 | * | 2/2002 | Bergstrom .................... 29/740 |

FOREIGN PATENT DOCUMENTS

| | | |
|---|---|---|
| EP | 0 496 586 A1 | 7/1992 |
| JP | 0 623 2591 | 8/1994 |
| WO | WO 00/38491 A1 | 6/2000 |

* cited by examiner

*Primary Examiner*—Mark A. Osele
(74) *Attorney, Agent, or Firm*—Birch, Stewart, Kolash & Birch, LLP

(57) ABSTRACT

System for handling components in connection with circuit board assembly in a component mounting machine. The system comprises a number of component tapes provided on component tape reels, and a number of tape guides arranged for receiving component tapes of a given component tape width and for bringing the component tape in position for feeding of the component tape and for picking components from the component tape in the component mounting machine. The tape guides have a similar geometrical outline and basic configuration, and each tape guide comprises a component exposure device for exposing a component at a picking position by removing the portion of the cover tape covering the component. The tape guides are divided into sub-sets of tape guides, wherein the tape guides of each individual sub-set have component exposure devices of the same design, which design is dependent on the configurations of the component tapes intended for that sub-set of tape guides.

Each tape guide also comprises visual marking for indicating the sub-set to which the tape guide belongs.

22 Claims, 14 Drawing Sheets

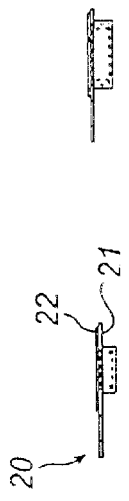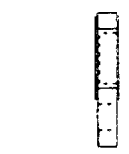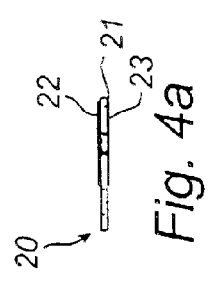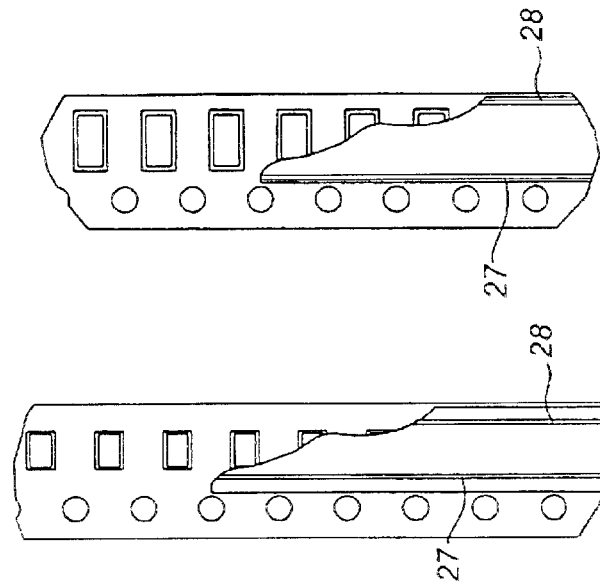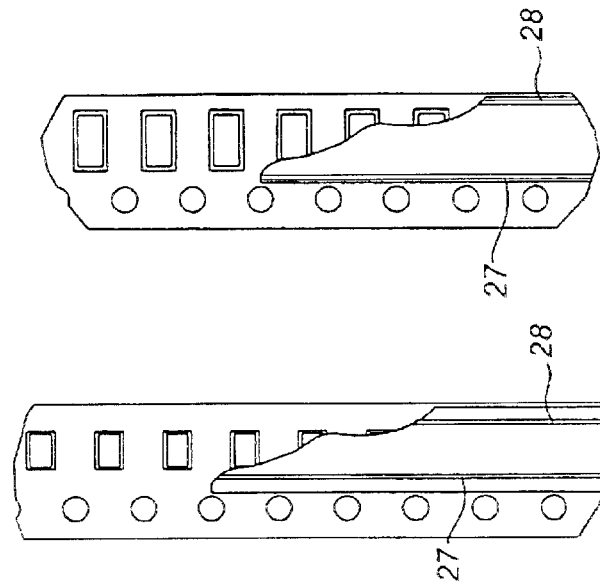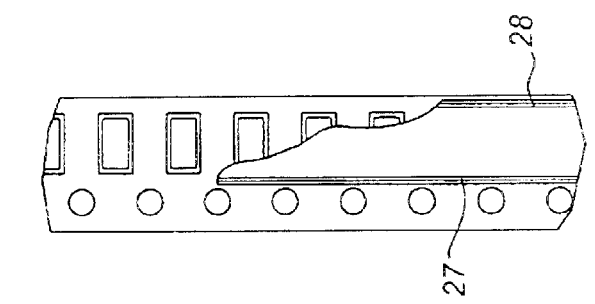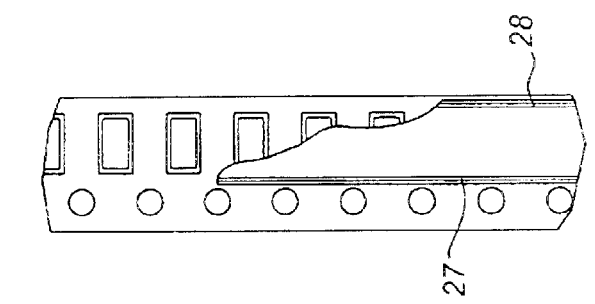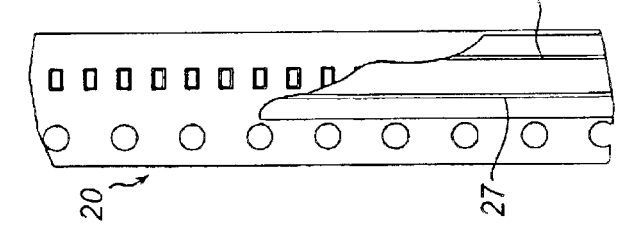

SYSTEM FOR HANDLING COMPONENTS AT A COMPONENT MOUNTING MACHINE

This application is a Continuation of application Ser. No. 10/246,730, filed on Sep. 19, 2002 Now U.S. Pat. No. 6,773,542, and for which priority is claimed under 35 U.S.C. § 120; and this application claims priority of Application No. 01850159.3 filed in Europe on Sep. 19, 2001 under 35 U.S.C. § 119; the entire contents of all are hereby incorporated by reference.

TECHNICAL FIELD OF THE INVENTION

The present invention generally relates to the field of manufacture and assembly of circuit boards. More specifically, the present invention relates to a system for handling components at a component mounting machine, the system comprising a plurality of component tapes, a plurality of component tape holders, each holder being arranged for holding a component tape, and a plurality of tape guides arranged for receiving a component tape and for bringing it in position for feeding and for picking components therefrom. The invention also relates to a tape guide for use in the system.

TECHNICAL BACKGROUND

Generally, within the field of manufacture and assembly of circuit boards, electronic components are fed to a component mounting machine for mechanically and/or electrically mounting the components onto a circuit board. These surface mounted components are often delivered spaced apart along the length of a component tape. Generally, two different types of component tapes are used. The first type consists of a lower carrier tape, preferably plastic, provided with component holding compartments, which are enclosed by a separable, thin, plastic upper cover, or cover tape or protective tape. The second type consists of a cardboard body provided with through holes. The body is provided with separable, thin, plastic, top and bottom cover tapes, thus forming component compartments with the through holes. For ease of description, the term cover tape will hereinafter refer only to the top cover, since the bottom cover is generally not removed during the component mounting process. Consequently, the term carrier tape will hereinafter also refer to the cardboard body with the bottom cover tape provided thereon.

The component tapes are further provided with a lateral portion, extending next to the compartments along the entire length of the component tape, provided with through holes. These through holes are used for engagement with an element of a feeding device of suitable type, the feeding device feeding the component tape into position for picking of components from the tape.

After having positioned the electronic components in their corresponding compartments, the cover tape is attached to the carrier tape, and the component tape is wound on a component tape holder, which within the art generally consists of a component tape reel. Then, the component holder is transferred to a component mounting machine, which feeds a component to a certain predetermined picking position where it can be picked, or collected, by a pick-up head.

The attachment of the cover tape to the carrier tape can, for instance, be performed by providing areas on either or both of the cover tape and the carrier tape with adhesive, or areas where the cover tape is fused to the carrier tape. Generally, these areas are elongated and run along the entire extension of the component tape, along and adjacent to each side of the component compartments.

According to one method for exposing and picking a component from a component tape, a particular type of tape guide is used for bringing the component tape in position for feeding the component tape by interaction with a feeding device, and for picking of components from the tape. The tape guide is provided with an exposure device, the exposure device exposing the components at a picking position, by separating and lifting a portion of the cover tape from the carrier tape, and leaving the remaining portion of the cover at least partially attached to the carrier tape. Furthermore, the tape guide is releasably mountable in a component mounting machine, or in a component magazine for use in the mounting process by the component mounting machine, and virtually operates as an adapter between the component tape and feeding and picking devices of the component mounting machine. Thus, a component tape is preferably first loaded into the tape guide, and the loaded tape guide is then mounted in position in or at the component mounting machine. A more detailed description of the tape guide and the methods of using such a tape guide are disclosed in co-pending U.S. patent applications Ser. Nos. 09/886,482 and 09/886,384, which are incorporated herein by reference.

The use of such a tape guide is advantageous in that, inter alia, it is easy to load the tape guide with a component tape, it is easy to mount the loaded tape guide in a component mounting machine, or in a magazine for use with the component mounting machine, and remove it therefrom, and the tape guide has a simple configuration and build-up without moving parts that is easy and cost-efficient to manufacture.

However, the result from using the above-mentioned method is not altogether satisfactory.

SUMMARY OF THE INVENTION

Thus, an object of the present invention is to provide an improved method of handling components using a tape guide as described above.

The present invention is based on the insight of using, for component tapes of the same width, different tape guides with specific component exposing devices for exposing the components carried by said component tapes, the design of said component exposure devices being dependent on the configuration of the component tape to be used with that tape guide, which configuration in turn is dependent on the size and configuration of the carried component. Thereby, use may be made of tape guides having a same or similar basic configuration and geometrical outline, but with different component exposure devices. Consequently, tape guides having one type of basic configuration are provided for handling component tapes with the same component tape width, wherein the tape guides are varied in terms of the design of the exposure device for the tape guide.

Furthermore, and according to preferred embodiments of the invention, use is made of visual markings for distinguishing between tape guides with different component exposure devices.

A significant advantage of the present invention is that it allows for the simply configured tape guides of the invention to be used independent of the type and size of different components to be handled and, in turn, of the configuration of the component tape on which they are provided. The invention also entails a facilitated handling in connection with the use of this type of component tape guides, since a minimum of auxiliary equipment and extra labor is required for handling a vast number of different component tapes and components.

It should be noted that the following description refers to component tapes having the same component tape width.

According to a first aspect of the present invention, there is provided a system for handling components at a component mounting machine, which system comprises a plurality of component tapes of a given component tape width, each component tape, in turn, comprising a carrier tape and a cover tape, and carrying components that are positioned in sequence on the carrier tape and are covered by the cover tape, wherein the component tapes have different configurations depending on the carried components. The system also comprises a plurality of component tape holders, each holder being arranged for holding a component tape, and a plurality of tape guides arranged for receiving a component tape of said given component tape width and for bringing said component tape in position for feeding of the component tape and for picking components from the component tape at said component mounting machine, wherein said tape guides are releasably mountable at said component mounting machine, preferably in a component magazine. Each tape guide is provided with a component exposure device, the exposure device exposing a component at a picking position by at least partly removing or displacing the portion of the cover tape covering said component. Also, said tape guides are divided into sub-sets of tape guides, wherein the tape guides of all sub-sets have a similar geometrical outline and basic configuration, and wherein the tape guides of each sub-set have component exposure devices of a same design which is different from the designs of the component exposure devices of the tape guides of the other sub-sets, the design of the component exposure devices within each sub-set of tape guides being dependent on said configurations of the component tapes intended for said sub-set of tape guides.

At present, there are a wide variety of different configurations for component tapes of the same component tape width. The thickness of the component tapes may vary, the size of the compartments may vary according to the components of the tape, the positions of the compartments, or rather the distance between the compartments, may also vary, as may the features of the cover tapes, both as to the positions of the adhesive or fused areas, as well as the width of the cover tape. However, the majority of components are provided on component tapes having a width selected from a few standardized component tape widths. For instance, at present approximately 80 percent of the components packed in component tapes and used in the circuit board assembling industry are provided on component tapes of 8 mm width.

Generally, each compartment contains one component only. Since the size of the components can vary greatly in component tapes of the same width, the size of the compartments varies accordingly. There must be sufficient space for accommodating the component, at the same time as there is a desire for the compartments to be small for limiting the movement of the component within the compartment, and for providing as many compartments as possible on the component tape. The difference in size refers to both the length and width of the compartment, as well as to the depth of the compartment. The depth of the compartment may also affect the overall thickness of the component tape. According to standardization protocols, the transversal center of each compartment is positioned at a defined distance from the lateral edge of the component tape. Thus, the distance from the lateral edge of the compartment to the lateral side of the component tape varies in accordance with the width of the compartment. Generally, the areas where the cover tape is attached to the carrier tape are positioned immediately adjacent to the lateral side of each compartment, i.e. between the compartment and the lateral edges of the component tape. For component tapes with very small compartments, these areas may be provided slightly spaced apart from the edges of the compartments. Furthermore, the width of the cover tape is generally the same for component tapes of the same width. However, there are exceptions where the width of the cover tape is varied within the same component tape width, essentially in correspondence with the width of the compartments.

The exposure device of a tape guide of the invention exposes a component by at least partly removing or displacing from the carrier tape the portion of the cover tape that covers the component. Preferably, this is performed by providing the exposure device with a separating portion that is brought into engagement with the component tape between the cover tape and the carrier tape, thus lifting the cover tape from the carrier tape. According to the present invention, the design of the exposure device is varied in accordance with the configuration of the component tape, in such a manner that the separating portion is brought into engagement with the component tape at the correct position. Thus, each tape guide is provided with an exposure device of a specific type adapted to the configurations of the component tapes for which the tape guide is intended. Consequently, the tape guides may be divided into sub-groups or sub-sets of tape guides, wherein the tape guides of all sub-sets have the same geometrical outline and basic configuration, while the design of the exposure devices of the tape guides varies between the tape-guides of different sub-sets. In other words, all tape guides within the same sub-set are adapted for handling the same multitude of types and configurations of component tapes with the same width.

In the following paragraphs, reference will be made to a component tape provided with two elongated adhesive areas provided on both sides of the compartments. However, the invention is also applicable to component tapes with other solutions for attaching the cover tape to the carrier tape, e.g. by fusing, at other or further positions, etc.

According to a preferred embodiment of the present invention, the separating portion of the exposure device is brought into engagement with the component tape at a lateral portion of the cover tape only. Thereby, a portion of the cover tape will be separated from the carrier tape on one side only, i.e. the cover tape will remain attached to the carrier tape on the other side of the compartment. Preferably, the separating portion has a width and is located at a position that is adapted to the configuration of the component tapes for which it is intended, i.e. to the width of the component compartments, the width of the cover tape and the positions of the respective adhesive areas. The width and position of the separating portion being such that the cover tape is separated from the carrier tape at one adhesive area, while leaving the adhesive area on the other side of the compartment at least partially intact, such that the cover tape remains attached to the carrier tape on that side of the compartment. According to this embodiment of the invention, a narrower separating portion is used for compartments having a smaller width.

Furthermore, according to preferred embodiments of the invention, the separating portion is arranged for advantageous engagement with the component tape essentially at the transversal center of the compartment, or in the vicinity thereof, which generally coincides with the transversal center of the cover tape, such that the tension in the cover tape is minimized during the separating procedure. This is advantageous in that it eliminates or at least significantly reduces the risk of the risk of possible ripping or cutting of the cover tape, which could lead to entanglement of portions of the cover tape that possibly might disturb the feeding of the component tape, as well as the picking of components. Preferably, the separating portion has a lateral extension in one direction that extends beyond the position of the adhesive area on that side of the compartment. Thus, according to this preferred embodiment, the width and lateral position of the separating portion is adapted to the configuration of the component tape, such that the separating portion is small enough and positioned to avoid separating the cover tape from the carrier tape at both sides of the compartment, and is wide enough and positioned for ensuring separation on one side of the compartment.

According to a preferred embodiment of the invention, the separating portion has a tongue-shaped tip portion that protrudes forward, i.e. against the feeding direction of the component tape. The tip portion preferably has an increased lateral extension in one direction for ensuring that the cover tape is separated from the carrier tape on one side of the compartment. The separating portion is further preferably provided with a wing portion for folding or bending the separated portion of the cover tape to the side, such that the compartment from which a component is to be picked is not at all covered by the covered tape.

According to an embodiment of the invention, the exposure device comprises a cover portion, which longitudinal extension is adapted to the configuration of the cover tape. Thus, for tape guides of different sub-sets for the same component tape width, the extension of said cover portion may vary. Preferably, the separating portion transcends into a cover portion that covers the component from the separating position to the picking position, such that the component is maintained in the correct position within the compartment. According to this embodiment, the extension of the cover portion is adapted such that a component exposed from the cover tape by the separating portion is covered by the cover portion until and including the position when the previous component is located at the picking position. Thereby, the described function of the cover portion is maintained regardless of the relative distance between adjacent component compartments.

Generally, the pitch of a component tape, i.e. the distance from the center of one compartment to the center of the adjacent or subsequent compartment, assumes a number of standardized values such that the majority of component tapes are provided with the same pitch. However, for component tapes carrying very large or very small components, the sizes of the compartments vary accordingly, thus making it impractical or impossible to maintain the same pitch.

For very small compartments, the standard pitch is decreased so that more components may be provided on each component tape, which entails that the distance between adjacent compartments may be very small. Preferably, the cover portion has a greater extension for component tapes provided with smaller compartments positioned at a reduced pitch, such that the cover portion covers the component tape closer to the picking position and, thereby, covers the next component to be picked. For larger components and compartments, the cover portion preferably has a smaller extension, such that the component tape is clear of the cover portion for a larger distance as counted from the center of the compartment that is located at the picking position, i.e. from the picking center. Thus, the cover portion will not interfere with the picking action, even though components are picked from compartments with a larger distance from the center to the rear edge of the compartments. Consequently, the extension of the cover portion is varied in accordance with the size of the compartments, and to the components contained therein, for component tapes of the same component tape width.

According to preferred embodiments of the invention, visual marking is provided for easily and quickly distinguishing between tape guides of different sub-sets. Thus, tape guides of the same sub-set of tape guides are provided with one or more visual markings that indicate to which sub-set the tape guide belongs. Then, the operator determines which visual marking indicates the tape guide to be used for a specific component tape, or component tape holder, and simply retrieves the tape guide having that marking. Thereby, the work for retrieving the tape guide to be used for a specific component tape is limited to a quick and easy visual identification.

The visual marking is provided on a portion of the tape guide which is easily visible or distinguishable both when the tape guide is mounted at the component mounting machine, and when it is not. Preferably, the visual marking is in the form of a label, preferably an adhesive label, or a small plate or inset, provided with a visual marking. Alternatively or additionally, the visual marking may constitute a part of the tape guide itself, e.g. the exposure device may be provided with a visual marking.

According to a preferred embodiment of the invention, the tape guide is provided with a protruding handle on which the visual marking is provided, e.g. as a label on the handle, an inset in the handle, or by providing the handle itself as a visual marking, e.g. with a specific color, shape, or the like.

According to a most preferred embodiment of the present invention, the visual marking is in the form of a specific coloring, which may be a single color or several colors. Thus, all tape guides within the same sub-set are provided with visual marking of the same color. According to other embodiments, the visual marking is in symbol or text form or in the form of patterns. These forms of visual markings may of course also be combined in order to enhance the ease of distinguishing between the tape guides of different sub-sets.

According to a specific embodiment, the exposure devices are provided with a visual marking. As an example, the exposure devices may be provided in different colors or with different patterns, whereby all similar exposure devices are provided in the same color or with the same pattern.

According to another embodiment, at least part or all of the tape guide is provided in a specific color or with a specific pattern. Then, all tape guides within the same sub-set have the same color or pattern, which differs from the tape guide colors or patterns of the tape guides of the other sub-sets.

It should be noted that although a number of different types of markings have been exemplified above, the term marking is to be interpreted in a broad sense, i.e. including all type of markings that may be used in distinguishing purpose.

According to further embodiments of the present invention, the component tape or the component tape holder, or both, is provided with a visual marking for facilitating the selection of which tape guide to use for a specific component tape. Preferably, but not necessarily, the visual marking correspond to that of the tape guide, i.e. the visual markings having the same pattern(s), symbol(s), color(s), or text, respectively. Then, the operator readily realizes that for a component tape, or component tape holder, with a specific visual marking, a tape guide with a corresponding marking is required. Thereby, the work for determining which tape guide to use for a specific component tape is limited to a very quick and simple visual identification, which reduces the time required for associating and loading new component tapes into tape guides, and significantly reduces the risk for selecting the wrong tape guide.

According to one embodiment, the component tape and/or the component tape holder as well as the tape guide are provided with a similar visual marking, e.g. similar or identical labels. According to another embodiment, the component tape and/or the component tape holder are produced with a color or pattern corresponding to the pattern or color of the visual marking of the tape guide. Then, the operator readily realizes that for a red component tape, or component tape holder, a tape guide with a red marking is required. Thereby, the work for determining which tape guide to use for a specific component (tape) is reduced even further to a very quick and simple color identification, and the risk of selecting the wrong tape guide is even further reduced.

As stated above, the base material for the tape may also vary, which normally affects the thickness of the lateral portion of the component tape, i.e. the portion provided with feeding holes. Generally, for plastic tapes, the thickness of the lateral portion of the component tape does not have to be related to the depth or size of the compartments, whereas for cardboard tapes the thickness usually corresponds to the depth of the compartments, which depends on the height of the components to be contained. This is due to the fact that a single, elongated cardboard element is used as the component tape, which is provided with through holes that makes up the feeding holes, as well as the compartments.

Furthermore, the feeding devices used for feeding a component tape in a component mounting process normally comprise feeding pins that is brought into engagement with the feeding holes of the component tapes. Generally, the feeding pins are mounted on the peripheral surface of a feeding wheel or on an arrangement for reciprocating, linear movement of the feeding pins.

According to a preferred embodiment of the invention, the tape guide is further provided with locking elements for mounting the tape guide at the component mounting machine in self-adjusting engagement with corresponding locking elements provided at the component mounting machine, preferably in a component magazine for use with the component mounting machine. The self-adjusting locking elements allows for the vertical position of at least part of the tape guide to be varied in accordance with the configuration of the component tape to be used with the tape guide. Thereby, a controlled lifting force on the component tape can be obtained, in addition to the lifting force provided from engagement of the component exposure device between the cover tape and carrier tape. A resulting increased contact pressure between the upper surface of the component tape and the lower surface of the cover portion of the component exposure device, thus preventing or significantly reducing the risk of components jumping out of their compartments, due to vibrations produced during feeding of the component tape, or from turning on the side or upside-down.

Preferably, said self-adjusting locking elements comprises forward pivotal locking elements, and rearward, displaceable locking elements. Thus, the rearward locking element interacts with corresponding locking elements at the component mounting machine that in a displaceable engagement that permits relative vertical movement or displacement of the rearward locking element. Thereby, the rear of the tape guide may be slightly raised and the tape guide thereby pivoted, while still maintaining a mounted position.

According to a preferred embodiment of the invention, a base surface of the device for feeding the component tape is brought into controlled, pressurized contact with the lateral portion of the component tape, thereby providing said lifting force of the component tape. The base surface is the surface from which the feeding pins for engagement with the feeding holes project. Thus, the components contained in the compartments, that have been exposed by moving the cover tape, that are covered by the above-described cover portion until the compartment reaches the picking position, are efficiently kept from jumping out of their compartments, due to vibrations produced during feeding of the component tape, or from turning on the side or upside-down.

As a consequence of the adjustability of the vertical position of the tape guide, the distance between the upper surface of the feeding device and the lower surface of the cover portion may be automatically adjusted in correspondence with the thickness of the lateral portion of the component tape. Preferably, the rear locking element is in biased engagement with the locking elements at the component mounting machine, whereby an essentially constant contact pressure between the surface of the feeding device and the lateral portion of the component tape.

The rear locking element of the tape guide is preferably in the form of an angled engagement surface interacting with a biased locking element at a component mounting machine. Said biased locking element may be in the form of a biased lever brought into sliding or otherwise displaceable engagement with the engagement surface. However, the described arrangement may be substituted for any biased engagement between locking elements at the component mounting machine, preferably in a component magazine, and the rearward locking elements of the tape guide that provides the desired, vertically displaceable mounting effect.

As understood by the person skilled in the art, the features of the rearward and forward locking elements of the tape guide could be switched such that the forward locking element is displaceable, and the rearward locking element is pivotal.

Further details and aspects of the present invention will become apparent from the following description of preferred embodiments of the invention.

BRIEF DESCRIPTION OF THE DRAWINGS

Preferred embodiments of the invention will now be described in greater detail with reference to the accompanying drawings, in which

FIGS. 3a–3e are plan views illustrating differently configured component tapes, and FIGS. 4a–4e are sectional views of the component tapes shown in FIGS. 3a–3e;

DESCRIPTION OF PREFERRED EMBODIMENTS

Figure 1:
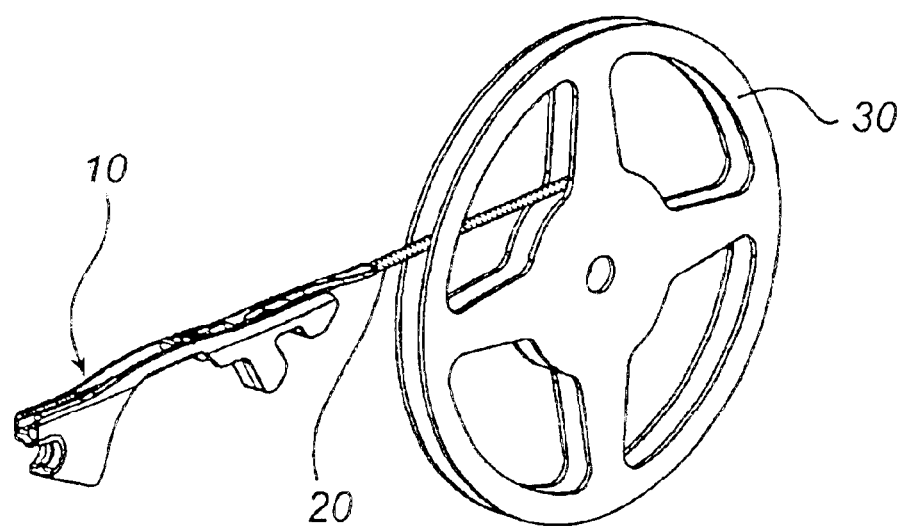
FIG. 1 illustrates the relationship between a tape guide, a component tape, and a component tape holder of the present invention.

The system according to preferred embodiments of the present invention comprises tape guides 10, component tapes 20 and component tape reels 30. In use, the component tapes 20 are wound onto component tape reels 30 and loaded into tape guides 10, as is illustrated in FIG. 1. The tape guides 10 are then mounted into a component mounting machine, or into a magazine for subsequent loading into a component mounting machine, which is the embodiment that will be described below. The tape guides 10 are further divided into sub-sets of tape guides, the tape guides of each sub-set comprising similar component exposure devices, while the tape guides of different sub-sets comprise different component exposure devices.

Figures 2A, 2B:
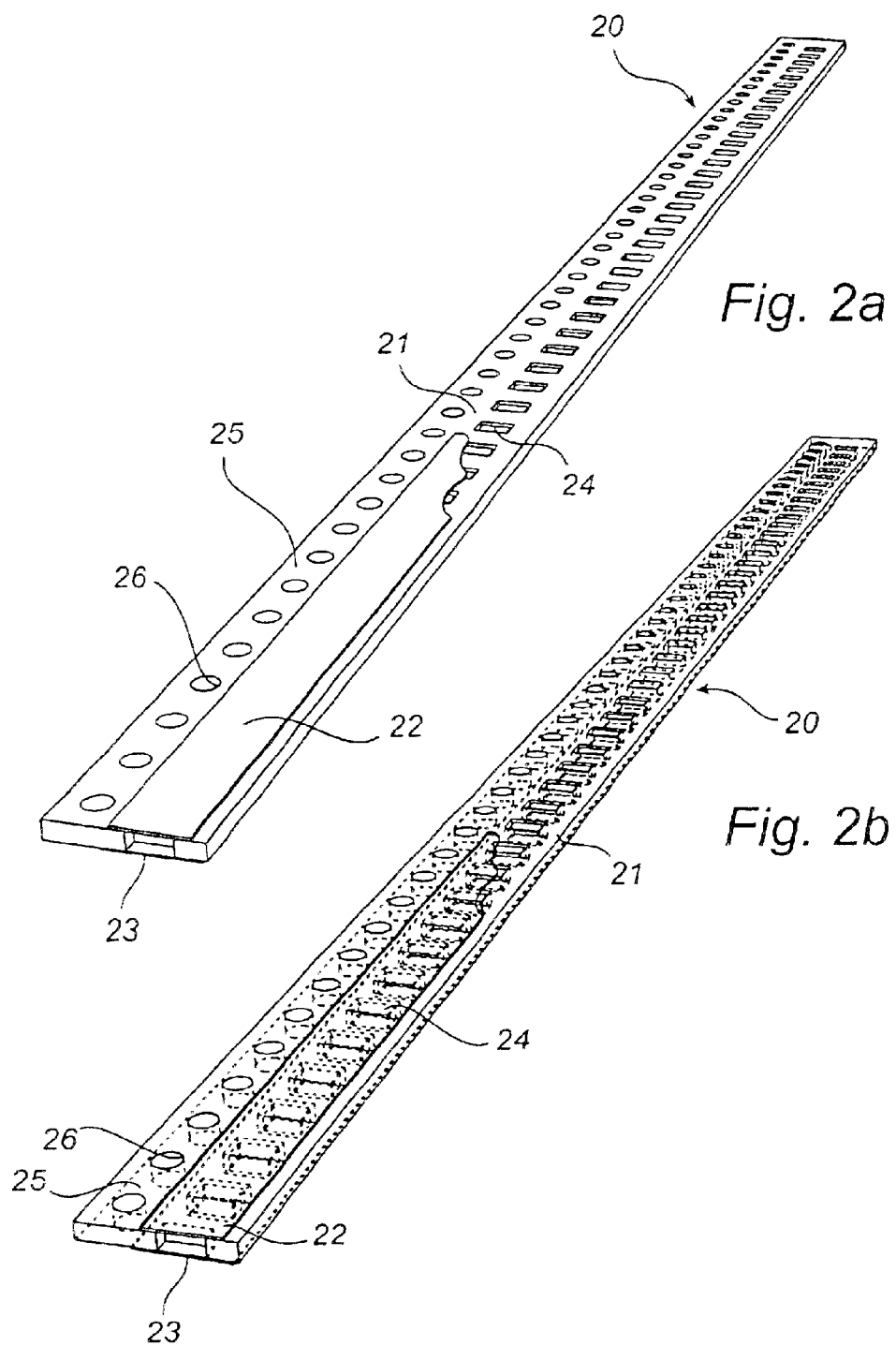
FIG. 2a is a perspective view and FIG. 2b is a phantom view showing the general structure of a component tape with a cardboard body.

With reference to FIGS. 2a–2b, 3a–3e and 4a–4e, the structure and varying configurations of component tapes will now be described. A component tape generally comprises two main parts, a carrier tape and a cover tape. The carrier tape comprises a card-board or plastic body 21 provided with compartments 24 for containing components, one in each compartment 24. For cardboard tapes, an example of which is illustrated in FIGS. 2a and 2b, the carrier tape also comprises a bottom cover 23 attached to the body 21 and extending along the entire length of the component tape 20, such that the body 21 and the bottom cover 23 together form the carrier tape for carrying components. Furthermore, the compartments 24 in cardboard tapes are provided as through holes 24 with the bottom cover 23 forming a bottom surface of the compartments. For plastic tapes, the body 21 normally constitutes the entire carrier tape of the component tape 20. The body 21 is further provided with a lateral portion 25 provided with through holes 26, which are arranged for engagement with a feeding device, said feeding device feeding the component tape 20 during the mounting procedure, normally in a component magazine.

As mentioned above, the component tape further comprises a cover tape 22, which generally consists of a thin, plastic, transparent sheath. The cover tape 22 is provided for enclosing the components contained in the compartments 24 and extends along the entire length of the component tape 20. Furthermore, the cover tape 22 is attached to the body 21 through the use of adhesive portions 27, 28. Alternatively, the cover tape 22 may be fused to the body 21 along the illustrated portions 27, 28.

Turning to FIGS. 3a–3e and 4a–4e, there is illustrated five examples of differently configured component tapes of the same component tape width, in which FIGS. 3a–3c and 4a–4c illustrate cardboard tapes, whereas FIGS. 3d–3e and 4d–4e illustrate plastic tapes. As can be seen in the figures, the cardboard tapes have the same thickness throughout the cardboard body 21, which is dependent on the depth of the compartment 24. The plastic tapes, however, have a thin lateral portion 25, the thickness of which generally not being dependent on the depth of the compartments.

Furthermore, and irrespective of the base material for the component tapes, the size of the compartments 24 can vary between component tapes of the same component tape width. However, according to standardization protocols, the distance from the edge of the component tape to the center of each compartment has a standard value for each component tape width. Furthermore, the pitch of the compartments 24, i.e. the distance between adjacent or subsequent compartments, can be varied, see particularly FIG. 3a in which the distance between the compartments is reduced.

Finally, the cover tape 22 and the attachment thereof to the carrier tape 21 can be varied. Even though the cover tapes shown all have the same width, this is not necessarily so. The width may be varied in accordance with the width of the compartments. The figures illustrate different positions of the adhesive or fused portions 27, 28 in correspondence with the compartment width. The width of these portions may of course also be varied.

Figure 5:
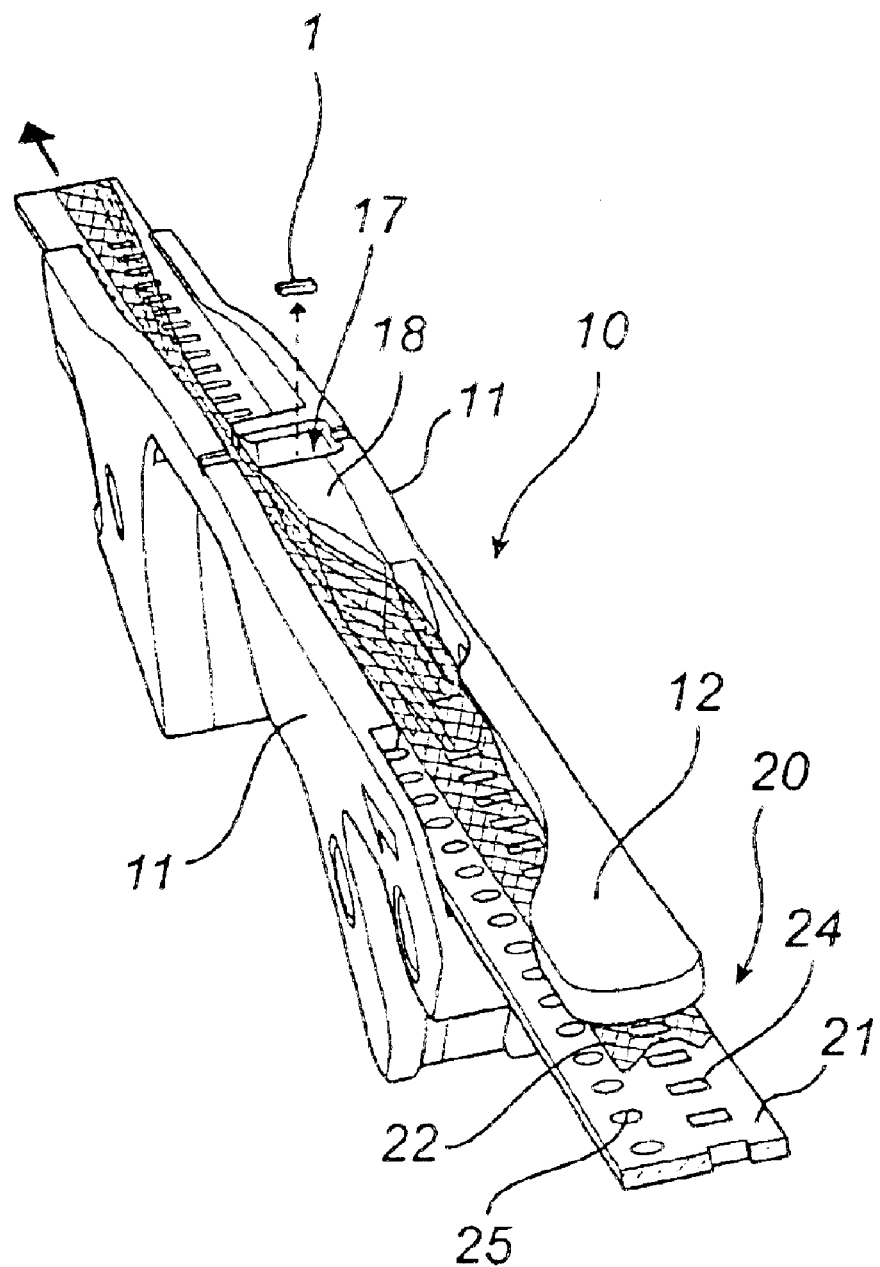
FIGS. 5, 6a and 6b illustrate the general structure of a tape guide according to the present invention.
Figure 6A:
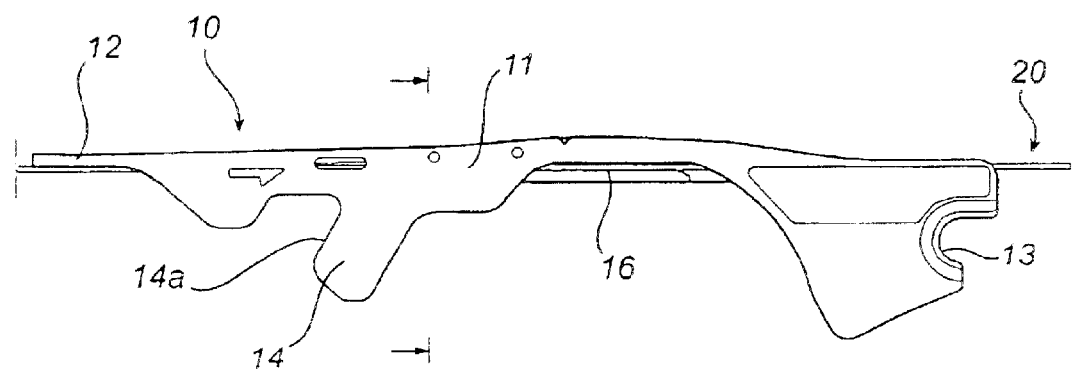
Figure 6B:
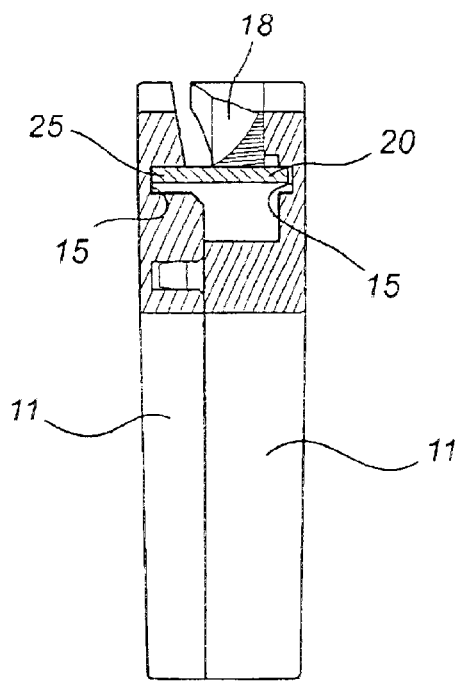

With reference now to FIGS. 5, 6a and 6b, there is shown the general outline of a tape guide according to preferred embodiments of the present invention, together with a section of a component tape 20 shown loaded into the tape guide 10. Generally, the tape guide comprises an elongated open-ended profile with opposing elongated tape guiding wall elements 11. The wall elements 11 are each provided with a longitudinal groove 15 for facilitating insertion of a component tape and guiding the component tape 20. The tape guide 10 is further provided with a recess 16 for enabling the pins or teeth of a feeding device 43 (see FIG. 9), provided in a magazine attached to a component mounting machine, to engage the feeding holes 26 of the component tape 20. A handle 12 is arranged in one end of the tape guide 10 for facilitating attachment and detachment of the tape guide 10 into and from the magazine of a component mounting machine. The tape guide 10 also comprises forward and rearward locking elements 13, 14 for attaching the tape guide into the magazine. The locking elements 13, 14 will be described in more detail below with reference to FIGS. 9–11.

During feeding of the component tape 20, in the feeding direction indicated by the arrow in FIG. 5, it passes an exposure device 18, which releases one side of the cover tape 22 from the carrier tape 21 and folds or bends the released portion of the cover tape to an upright position. While the cover tape is in the upright position, the components are exposed in sequence at a picking position or slot 17 where the components can be picked by a pick-up head, as illustrated in the figure by the component 1.

Figure 7:
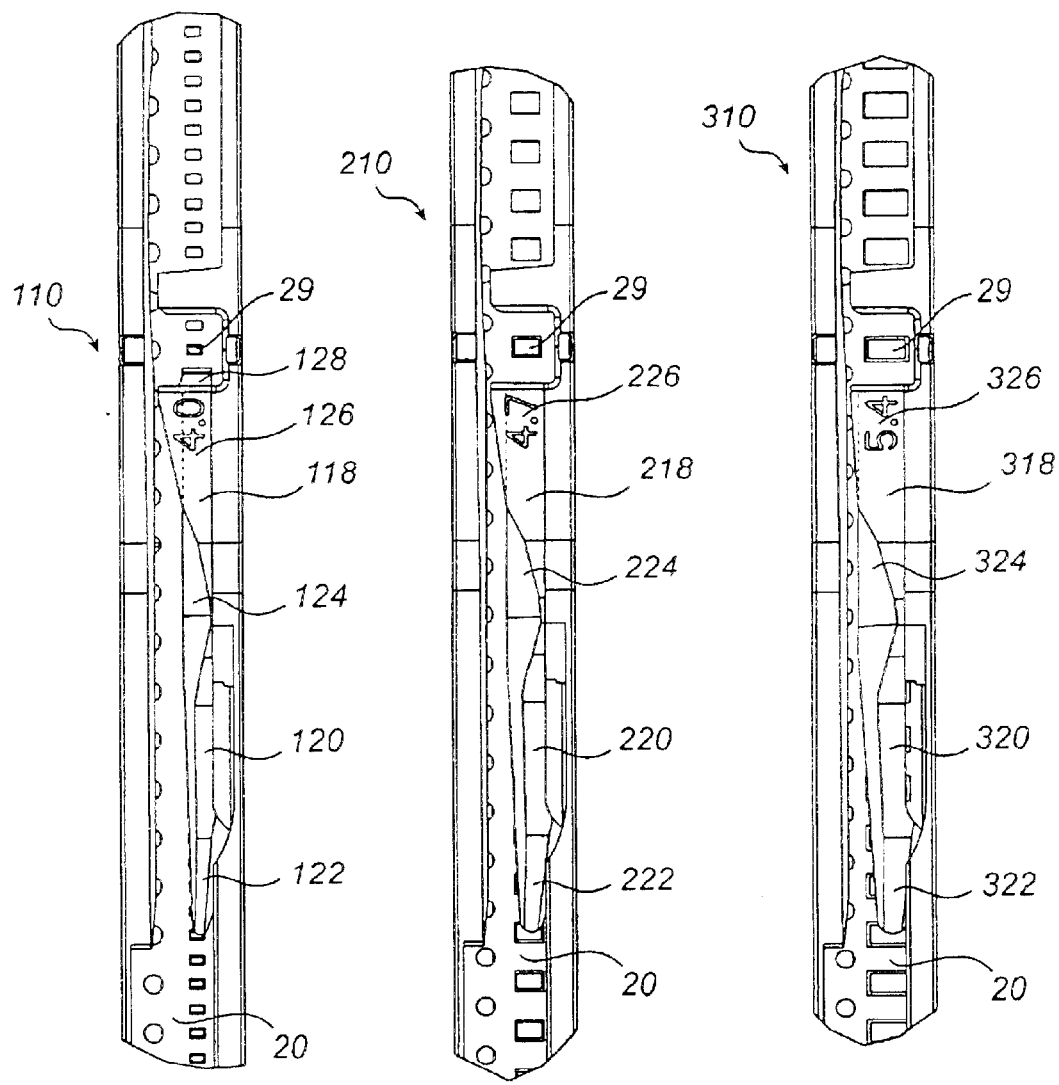
FIG. 7 illustrate three tape guides arranged for receiving differently configured component tapes.

In FIG. 7, which comprises enlarged partial views of tape guides 10, the exposure device 18 is shown in greater detail and in three different variants, wherein tape guide 110 is arranged for small-sized compartments, tape guide 210 is arranged for medium-sized compartments, and tape guide 310 is arranged for large-sized compartments, all component tapes having the same tape width. The exposure device 118, 218, 318 comprises a forward, i.e. facing the component tape during feeding thereof, separating portion 120, 220, 320, which in turn comprises a tongue-shaped tip portion 122, 222, 322 for separating and lifting the cover tape 22 from the carrier tape 21, and a wing portion 124, 224, 324 for bringing the cover tape 22 into an upright position. Finally, the exposure device 118, 218, 318 comprises a cover portion 126, 226, 326 for covering the component between the position of lifting the cover tape and the picking position 17.

As clearly illustrated by FIG. 7, the design of the respective exposure device 118, 218, 318 is adapted to the configuration of the respective component tape 20. Thus, for small compartments, the tip portion 122 is smaller, both as regards the width and the height (not shown) of the tip portion 122, than the tip portions 222, 322 for medium-sized and large compartments, respectively. Furthermore, the lateral extensions of the wing portions 124, 224, 324 varies between the three variants. This provides for complete exposure from the cover tape of a component at the picking position, while at the same time not separating the cover tape from the carrier tape on both sides of the compartments, even though the width of the compartments varies.

The numbers provided at the forward end of the cover portion denote the distance in millimeters from the inner wall of the longitudinal groove 15 to the opposite lateral edge of the exposure device, which essentially corresponds to the lateral distance from the edge of the component tape 20 that the cover tape 22 is separated from the carrier tape 21. The illustrated tape guides are arranged for receiving component tapes having a width of 8 mm.

Also, the rearward extension, as seen in the feeding direction of the component tape, of the cover portions 126, 226, 326 varies. Thereby, the compartment in turn to reach the picking position is completely covered by the cover portion 126, 226, 326 during the picking of a component in the previous compartment, while at the same time the previous compartment is completely exposed to a pick-up head.

Figure 8A:
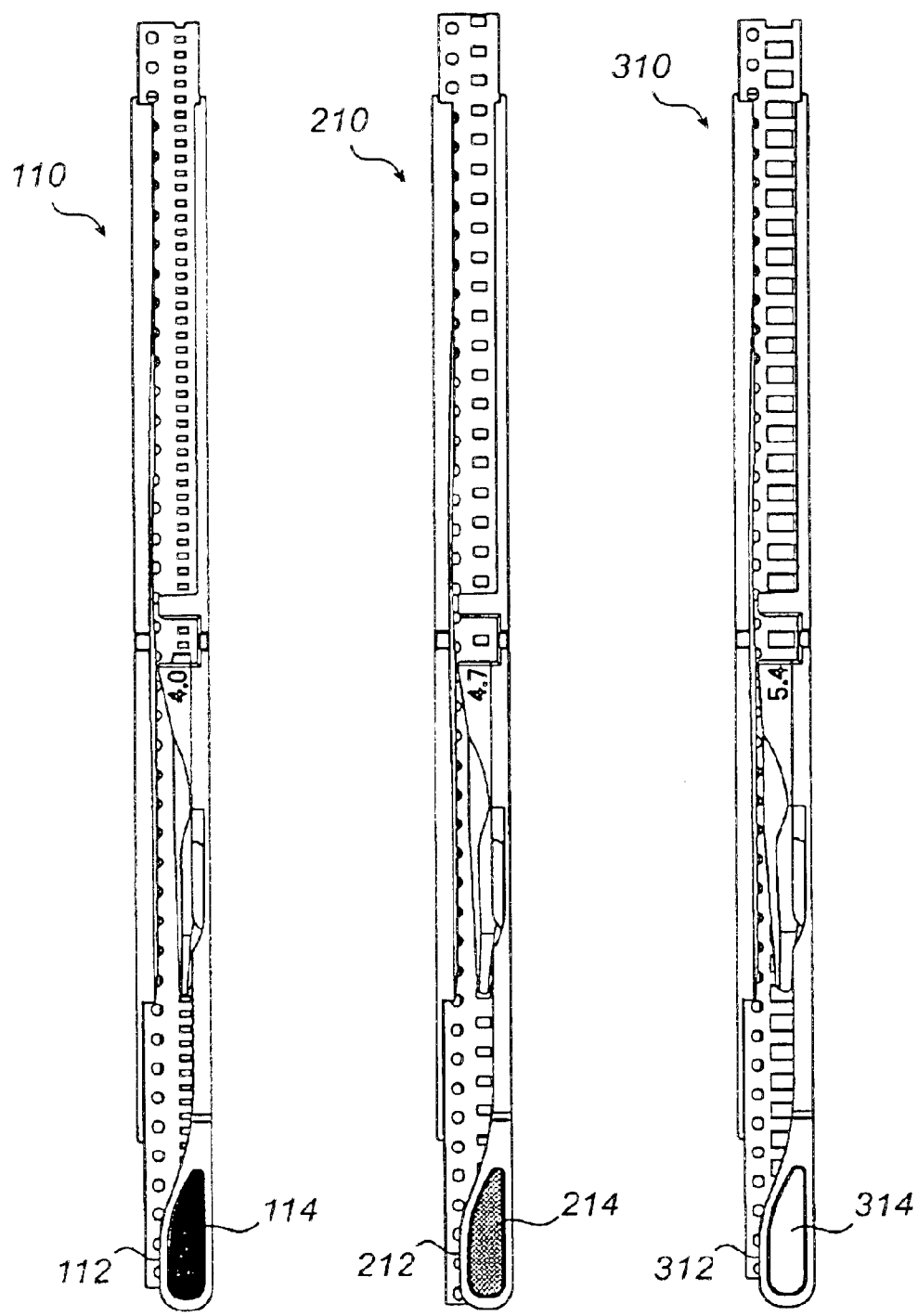
FIGS. 8a–8e illustrate alternative embodiments of different visual markings in accordance with embodiments of the present invention.
Figure 8B:
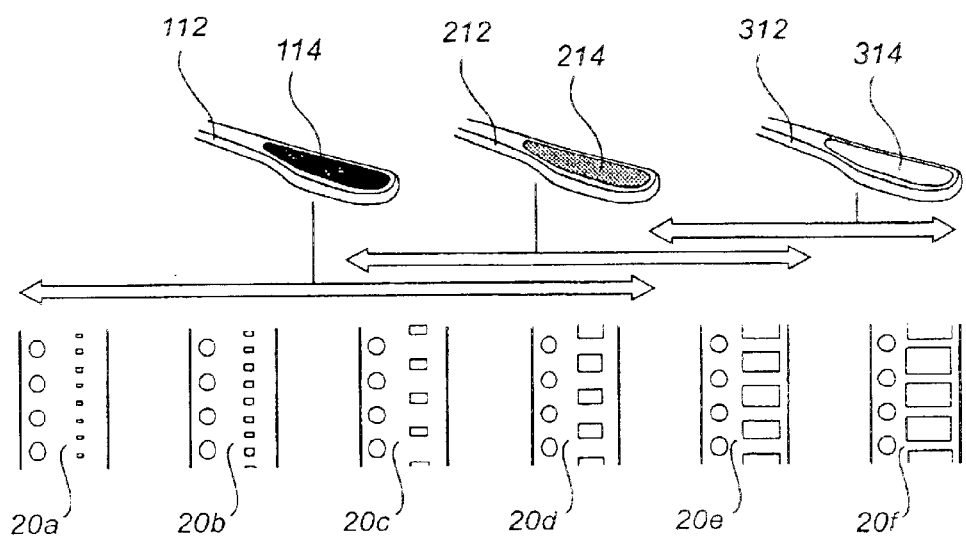

Turning now to FIGS. 8a–8e, there are shown alternative embodiments of tape guides of the present invention. In these figures, the handle 112, 212, 312 is provided with a visual marking 114, 214, 314 for indicating that the tape guide belongs to a specific sub-set of tape guides, the tape guides within each different sub-set being provided with component exposure devices of the same design, i.e. the same size and shape. In FIGS. 8a and 8b, there is shown color or gray scale markings 114, 214, 314. In FIG. 8b, there is schematically illustrated how the tape guides 110, 210, 310 may be selected in accordance with component tape configurations. As indicated by the arrows, the tape guide 110, of which the handle 112 and marking 114 is shown, is selected for the component tapes 20a–20d that are provided with smaller compartments. Furthermore, the tape guide 210, with handle 212 and marking 214, is selected for the component tapes 20c–20e with the medium sized compartments, and the tape guide 310, with handle 312 and marking 314, is selected for the component tapes 20e and 20f with the larger compartments. It should be noted that different tape guides may be suitable for one component tape configuration, e.g. as shown in the figure with regards to component tape 20d.

Figure 8C:
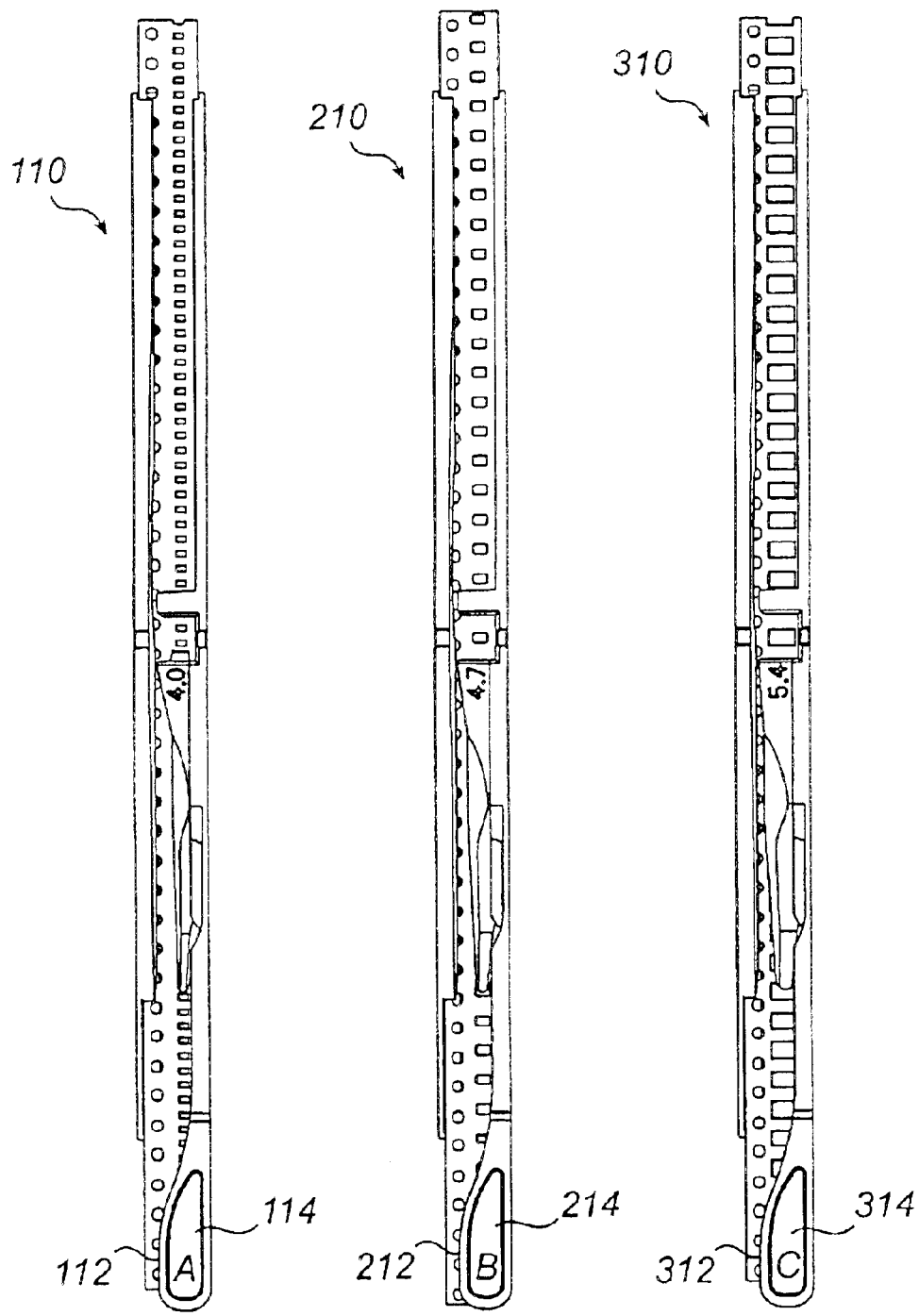
Figure 8D:
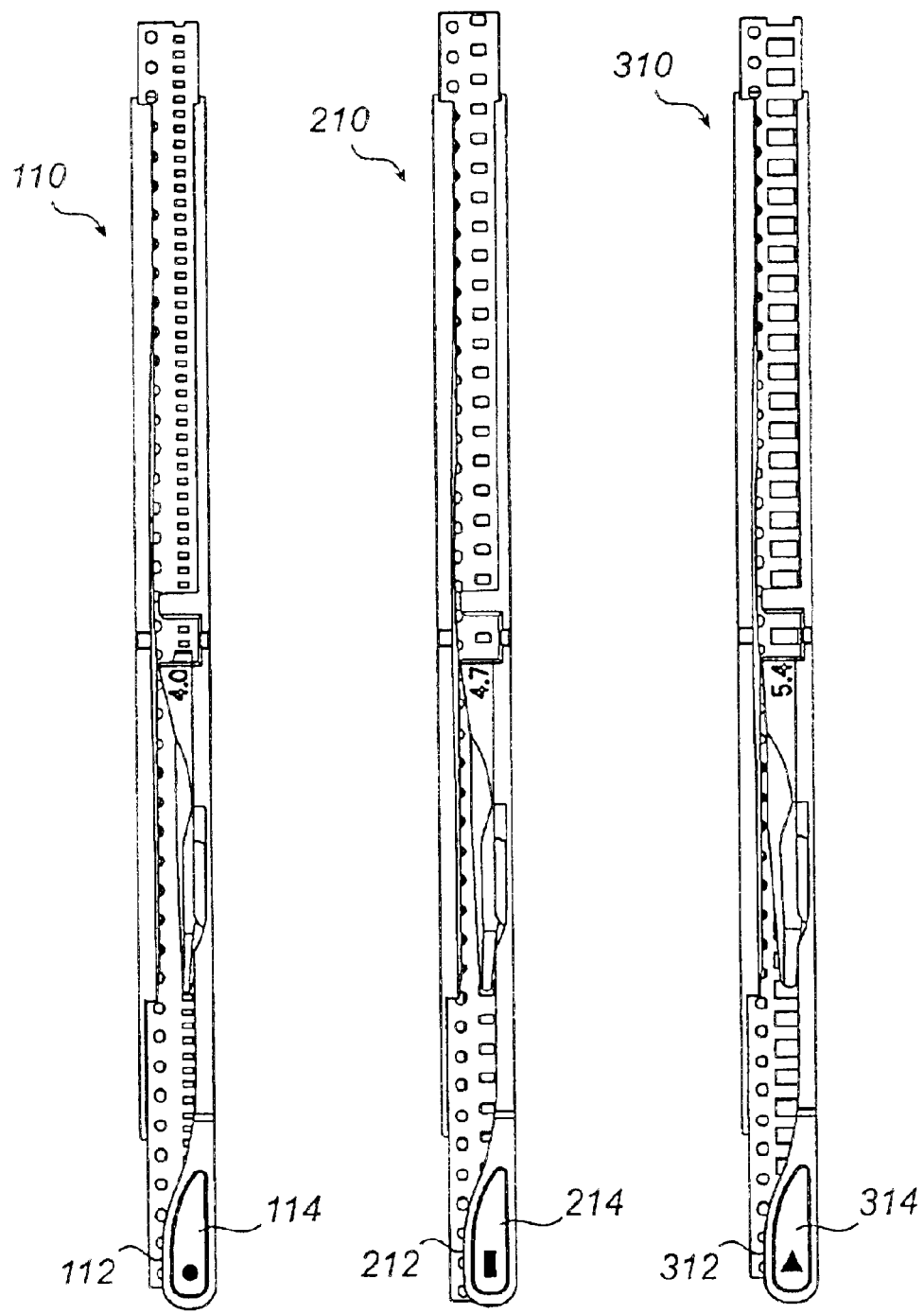
Figure 8E:
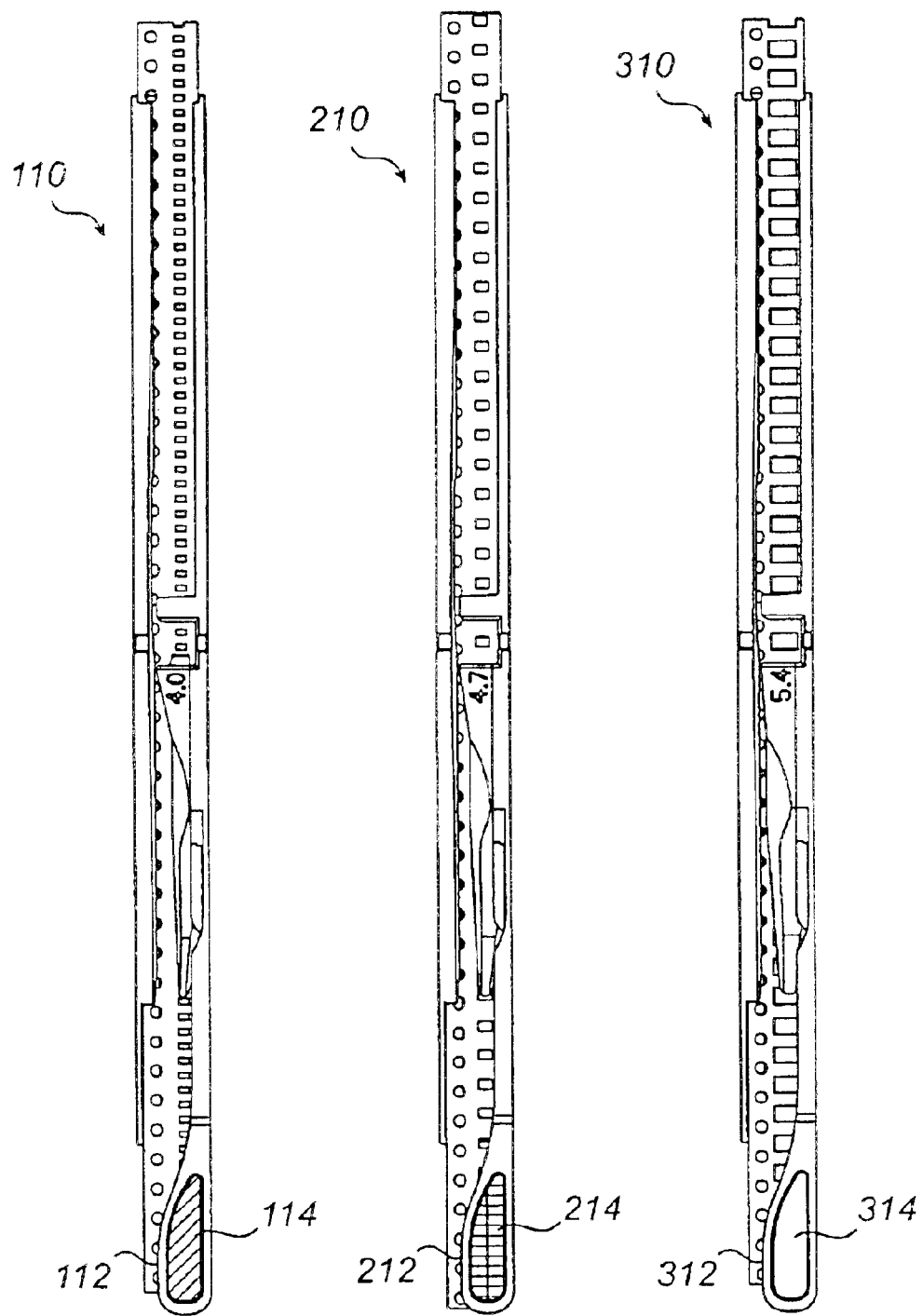

In FIGS. 8c–8e there is shown further examples of visual markings. FIG. 8c illustrate the tape guides with text markings 114, 214, 314. In FIG. 8d, the visual markings are in the form of visual markings 114, 214, 314 in the form of symbols, and in FIG. 8e there is shown pattern markings 114, 214, 314. As understood by the skilled person, the invention is not restricted to a specific type of visual marking. Any type of visual markings, or combinations thereof, is conceivable within the scope of the invention. Furthermore, the visual markings shown are provided on the handle, as an inset or a label. However, the marking could be provided anywhere on the tape guide that is easily located and recognized by the operator.

Figure 9:
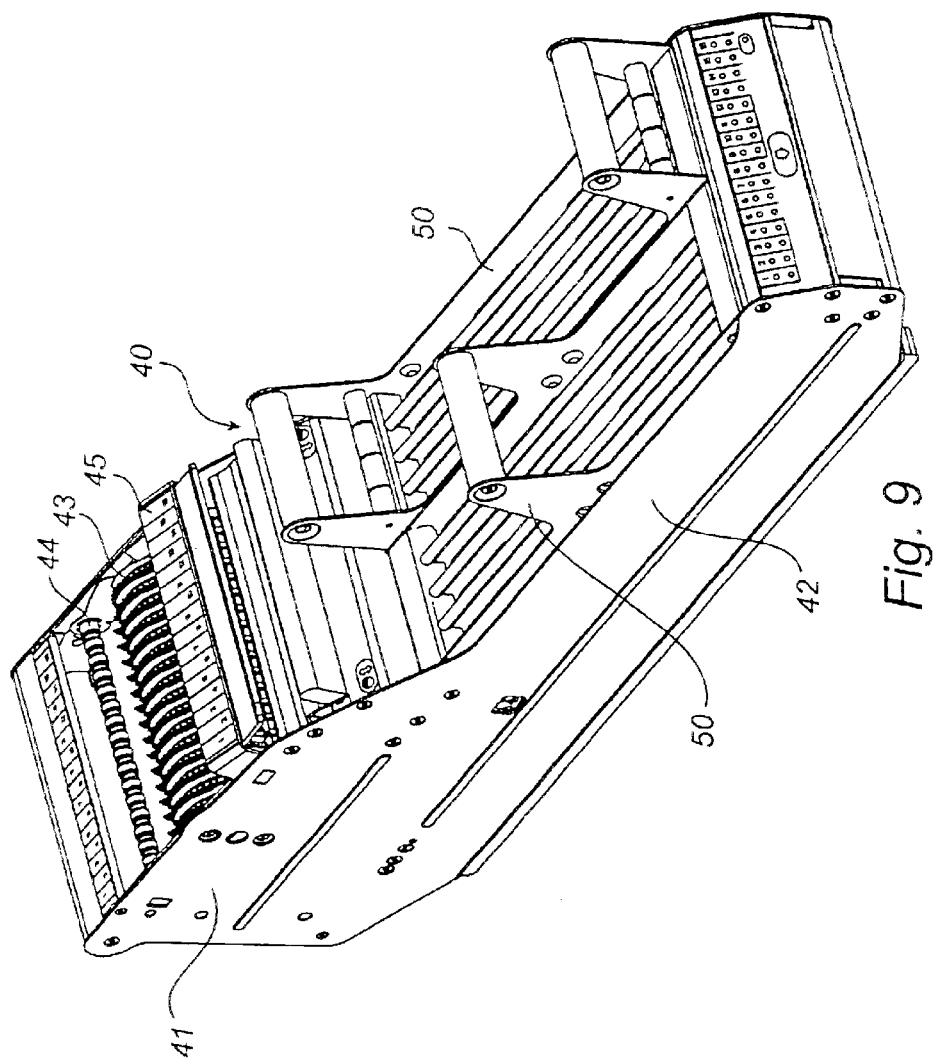
FIG. 9 illustrates a component magazine in which the tape guide according to an embodiment of the invention may be used.
Figure 10:
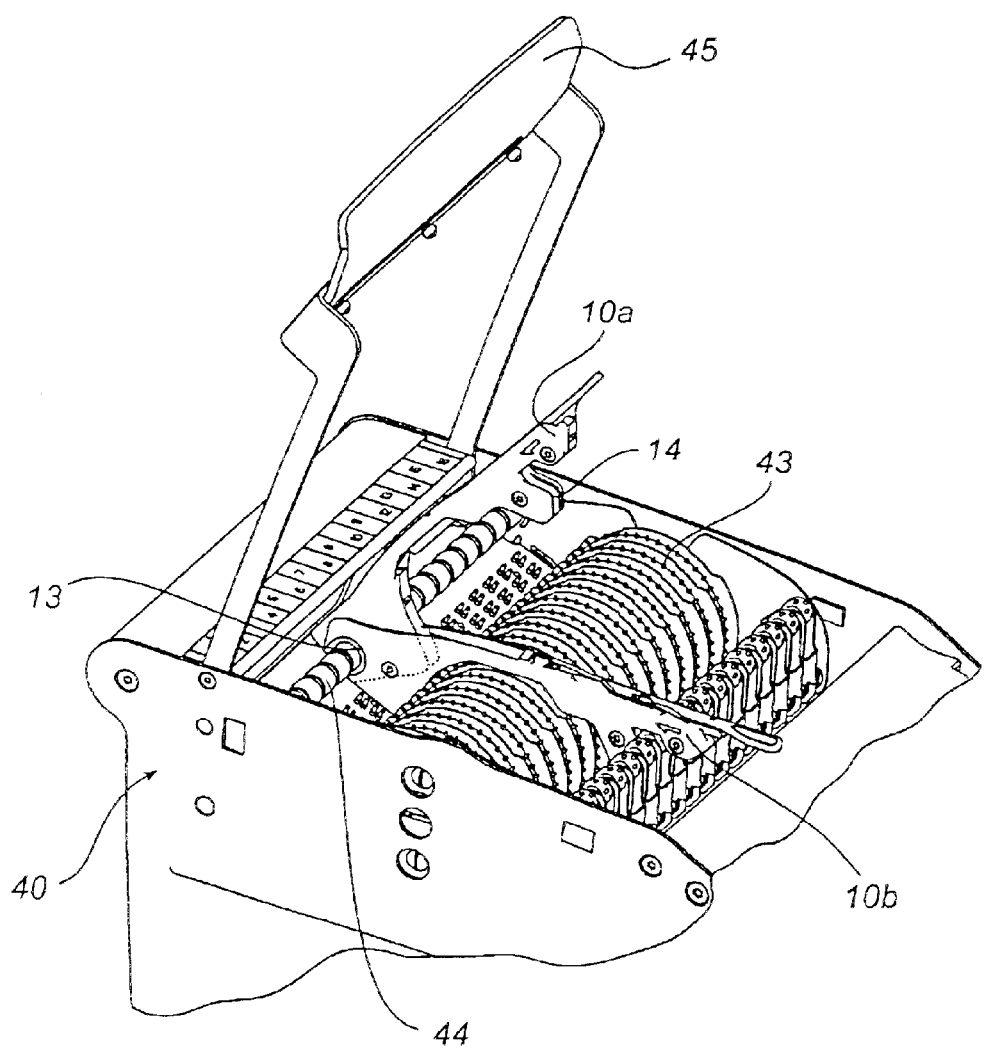
FIG. 10 illustrates the loading of a tape guide in the magazine of FIG. 9.
Figure 11A:
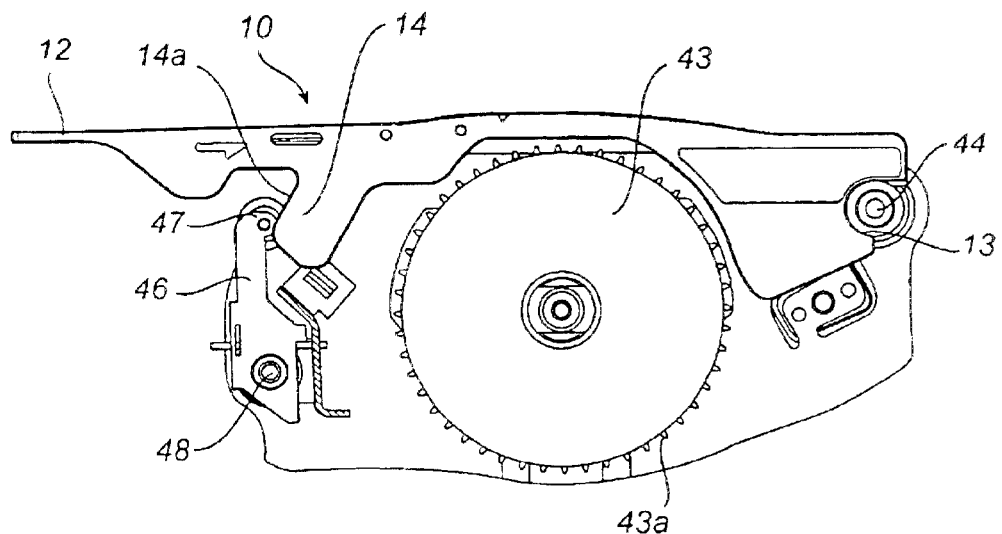
FIGS. 11a and 11b illustrate the mounting arrangement between the magazine of FIG. 9 and a tape guide according to an embodiment of the present invention.
Figure 11B:
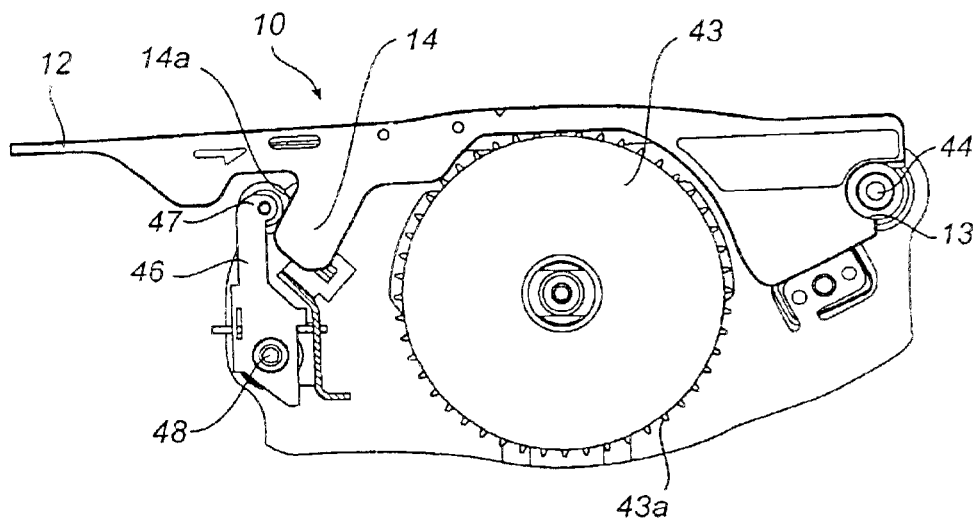

With reference now to FIGS. 9–11, there will be described a preferred embodiment of the present invention. A component magazine 40 comprises a forward portion 41 for receiving tape guides 10 and for feeding component tapes 20 loaded in the tape guides 10 to a picking position in the component mounting machine. The magazine 40 further comprises a rearward portion 42 arranged for receiving component tape carriers 50, which are arranged for holding the component tapes 20 and component tape reels 30. The forward portion 41 of the magazine 40 comprises a feeding mechanism, including feeding wheels 43, forward locking elements 44 adapted for receiving a plurality of tape guides, rearward locking elements 46 (see FIGS. 11a and 11b), and a safety barrier 45. Each tape guide 10 is placed and mounted in the magazine by interaction between the forward locking element 13 of the tape guide 10 and the forward locking element 44 of the magazine 40, and between the rearward locking element 14 of the tape guide 10 and the rearward locking element 46 of the magazine 40. When mounted in the magazine, the tape guides 10 are in a position where the feeding pins 43a of the feeding wheels 43 of the magazine can engage the feeding holes 26 of the component tape 25 loaded into each tape guide and, thereby, feed the component tapes towards a picking position in the machine. The safety barrier 45 ensures, in a lowered position as shown in FIG. 9, that all tape guides, mounted into the magazine, are correctly locked in an operational position. During insertion or removal of the tape guides the safety barrier 45 is raised, as is shown in FIG. 10.

With particular reference to FIG. 10, there is shown a partial view of a portion of the magazine 40 of FIG. 9 for illustration of the loading of tape guides 10 in the magazine 40. Two tape guides 10 are shown, one already having been mounted in the magazine 40 and one in the process of being mounted. The mounting is performed by first having the forward locking element 44 engaging with the forward locking element 13 of the tape guide, which in this embodiment are an axle 44 and a corresponding essentially semi-circular recess 13. This is illustrated by the tape guide 10a. Then, the tape guide is simply pivoted downwards, such that the rearward locking elements 46 of the magazine 40, in the preferred embodiment being spring-back locking elements, engage with the rearward locking elements 14 of the tape guides 10 (see FIG. 6a). Following snap-in engagement between the rearward locking element 46 of the magazine 40 and the corresponding locking element 14 of the tape guide 10, the mounting operation is completed. The completed mounting is illustrated by tape guide 10b. For removal of the tape guides 10, the rearward locking elements 14, 43 are easily released by simply raising the handle 12 of the tape guide 10.

In the mounted position, the feeding holes of a component tape loaded in the tape guide (see FIG. 3) engage with the feeding pins of a feeding wheel 43 in the magazine 40. Furthermore, the tape guide is provided with an electronic circuit that automatically is connected to electronic connections in the magazine 40, such that information regarding the tape guide and the component tape is automatically accessible by the control system of the component mounting machine.

In FIGS. 11a and 11b, there is shown in greater detail the mounting or locking arrangement of the tape guide 10 into the magazine 40. As described above, the forward locking elements are in the form of an axle 44 and a corresponding, semi-circular recess 13. At the opposite end of the tape guide 10, the rearward locking element of the tape guide is in the form of a protrusion 14 provided with an angled, recessed engagement surface 14a. The corresponding rearward locking elements of the magazine 40 is a biased lever 46, comprising an upper portion 47 for engagement with the engagement surface 14a. The upper portion is shown provided with a wheel for rolling engagement with the surface 14a. However, any engagement that permits relative vertical movement or displacement between the co-operating rearward locking elements 14, 46 is conceivable. At the opposite or lower end, the lever 46 is pivotally mounted in the magazine. The bias of the lever is preferably provided with a torsion or turning spring (not shown). It should be noted that the disclosed arrangement could be substituted for any biased arrangement of the rearward locking elements that provides the intended function, as realized by the person skilled in the art.

With the described arrangement, a snap-in mounting of the tape guide 10 in the magazine 40 is achieved. Furthermore, the tape guide may be pivoted slightly about a pivot center defined by the forward locking elements 13, 44 without releasing the tape guide 10 from the mounted position. Thus, the vertical position of the mounted tape guide 10 may be varied, as is evident from the FIGS. 11a and 11b, in accordance with the thickness of the lateral portion 25 of the component tape 20, as will now be described.

As can be seen in FIG. 6b, which is a sectional view of the tape guide shown in 6a, the component tape 20 is guided by the longitudinal grooves 15. The engagement of the exposure device 18 between the cover tape 21 and the carrier tape 22 lifts the component tape 10 such that the upper surfaces of the component tape 20 contacts the upper inner wall of the longitudinal grooves 15. The contact is desirable, since it brings exposed compartments closer to the cover portion 126, 226, 326 and thereby prevents components from "jumping out" of the compartments. However, the lifting action of the component tape is only provided by the attachment forces between the cover tape 22 and the carrier tape 21, which is insufficient. This lifting could be aided by providing a support spring (not shown) underneath the component tape. However, the provision of such a spring would result in a frictional force between the support spring and the component tape which will impair the feeding of the tape guide.

According to this embodiment, the lifting action is provided by bringing the upper surface of the feeding wheel 43, i.e. the surface from which the feeding pins 43a project, to apply upward pressure on the lateral portion 25 of the tape guide 26. Since the surface of the feeding wheel 43 moves simultaneously with the component tape 20, there will be no resulting frictional force between the feeding wheel 43 and the component tape 20 that will hamper the feeding action.

The self-adjusting mounting arrangement between the tape guide 10 and the magazine 40 allows for a controlled contact between the surfaces of the feeding wheel 43 and the lateral portion 25 of the component tape 10 regardless of the thickness of the lateral portion 25. Thus, if a component tape with a thicker or thinner lateral portion 25 is loaded in the mounted tape guide 10, the rearward locking elements 14, 46 will interact to self-adjust the vertical position of the tape guide at the feeding wheel to an appropriate position. The angle of the engagement surface 14a and the bias of the lever 46 ensures that an appropriate contact pressure between the feeding wheel 43 and the component tape 20 is obtained. FIG. 11a is intended to illustrate the self-adjusted position of the tape guide 10 when a component tape with a thicker lateral portion is loaded into the tape guide, and FIG. 11b is intended to illustrate the self-adjusted position of the tape guide 10 when a component tape with a thinner lateral portion is loaded into the tape guide, even though the component tapes themselves have been omitted for ease of illustration. Thus, a single tape guide 10 may equally be used with a plastic tape or a cardboard tape, which generally has a thicker lateral portion than the plastic tape.

As understood by the person skilled in the art, although the system of the present invention is limited to component tapes of the same component tape width, the invention is not restricted to a particular component tape width. Thus, the system of the invention is equally applicable any given component tape width, as long as all component tapes of the system have the same component tape width.

Even though the invention has been described above using exemplifying embodiments thereof, alterations, modifications and combinations thereof, as understood by those skilled in the art, may be made within the scope of the invention, which is defined by the accompanying claims.

What is claimed is:

1. A tape guide for guiding a component tape at a component mounting machine and for bringing said component tape in position for feeding of the component tape and for picking components from the component tape by said component mounting machine, the component tape carrying components positioned in sequence on a carrier tape and covered by a cover, the tape guide comprising:
    a component exposure element arranged for exposing a component at a picking position by at least partly removing or displacing the portion of the cover covering said component, and
    locking elements for engagement with corresponding locking elements provided in said component mounting machine, wherein said locking elements are arranged for self-adjusting engagement with said corresponding locking elements in adaptation to the thickness of the carrier tape.

2. The tape guide as claimed in claim 1, wherein said self-adjusting engagement is arranged to provide a controlled contact pressure between the component mounting machine and the carrier tape at the picking position regardless of the thickness of the carrier tape.

3. The tape guide as claimed in claim 1, wherein said carrier tape comprises a central portion provided with a series of compartments along the carrier tape for containing said components, and lateral portions provided along the carrier tape on either side of said central portion, wherein said adaptation is an adaptation to the thickness of the lateral portions of the cover tape.

4. The tape guide as claimed in claim 3, wherein one of said lateral portions is provided with holes for enabling feeding of the component tape by engagement in said holes by a feeding device, and
    wherein said adaptation is an adaptation to the thickness of the lateral portion provided with said holes.

5. The tape guide as claimed in claim 1, wherein said locking elements include first and second locking elements positioned at opposite ends of said tape guide, said first locking element being arranged for pivotal engagement and said second locking element being arranged for displaceable engagement with said corresponding locking elements, such that the tape guide when mounted may be slightly pivoted about said first locking element in adaptation to said thickness of the carrier tape.

6. The tape guide as claimed in claim 5, wherein said second locking element comprises an angled engagement surface for engagement with a biased locking element of said corresponding locking elements, wherein the engaging portion of said biased locking element is displaceable along said angled engagement surface, whereby the tape guide is pivotal in a mounted position at said component mounting machine for providing said self-adjusting engagement.

7. The tape guide as claimed in claim 1, wherein said tape guide is releasably mountable in said component mounting machine.

8. The tape guide as claimed in claim 1, wherein the tape guide lacks component tape feeding means and is arranged for allowing component tape feeding means provided in the component mounting machine to engage with the carrier tape for feeding the carrier tape towards the picking position.

9. The tape guide as claimed in claim 1, wherein the component exposure element comprises a separating portion for separating and lifting a lateral portion of the cover tape from the carrier tape, while leaving the remaining lateral portion of the cover tape at least partially attached to the carrier tape, and for bringing the lifted portion of the cover tape aside.

10. A tape guide for guiding a component tape at a component mounting machine and for bringing said component tape in position for feeding of the component tape and for picking components from the component tape by said component mounting machine, the component tape carrying components positioned in sequence on a carrier tape and covered by a cover, the tape guide comprising:
- a component exposure element arranged for exposing a component at a picking position by at least partly removing or displacing the portion of the cover covering said component, and
- locking elements for engagement with corresponding locking elements provided in a component tape magazine arranged for loading into said component mounting machine, wherein said locking elements are arranged for self-adjusting engagement with said corresponding locking elements in adaptation to the thickness of the carrier tape.

11. The tape guide as claimed in claim 10, wherein said self-adjusting engagement is arranged to provide a controlled contact pressure between the component tape magazine and the carrier tape at the picking position regardless of the thickness of the carrier tape.

12. The tape guide as claimed in claim 10, wherein said carrier tape comprises a central portion provided with a series of compartments along the carrier tape for containing said components, and lateral portions provided along the carrier tape on either side of said central portion, wherein said adaptation is an adaptation to the thickness of the lateral portions of the cover tape.

13. The tape guide as claimed in claim 12, wherein one of said lateral portions is provided with holes for enabling feeding of the component tape by engagement in said holes by a feeding device, and wherein said adaptation is an adaptation to the thickness of the lateral portion provided with said holes.

14. The tape guide as claimed in claim 10, wherein said locking elements include first and second locking elements positioned at opposite ends of said tape guide, said first locking element being arranged for pivotal engagement and said second locking element being arranged for displaceable engagement with said corresponding locking elements, such that the tape guide when mounted may be slightly pivoted about said first locking element in adaptation to said thickness of the carrier tape.

15. The tape guide as claimed in claim 14, wherein said second locking element comprises an angled engagement surface for engagement with a biased locking element of said corresponding locking elements, wherein the engaging portion of said biased locking element is displaceable along said angled engagement surface, whereby the tape guide is pivotal in a mounted position in said component tape magazine for providing said self-adjusting engagement.

16. The tape guide as claimed in claim 10, wherein said tape guide is releasably mountable in said component tape magazine.

17. The tape guide as claimed in claim 10, wherein the tape guide lacks component tape feeding means and is arranged for allowing component tape feeding means provided in the component tape magazine, to engage with the carrier tape for feeding the carrier tape towards the picking position.

18. The tape guide as claimed in claim 10, wherein the component exposure element comprises a separating portion for separating and lifting a lateral portion of the cover tape from the carrier tape, while leaving the remaining lateral portion of the cover tape at least partially attached to the carrier tape, and for bringing the lifted portion of the cover tape aside.

19. An arrangement for guiding and feeding component tapes at a component mounting machine, the component tapes carrying components positioned in sequence on a carrier tape and covered by a cover, the arrangement comprising:
- at least one tape guide arranged for guiding said component tapes at the component mounting machine, and
- a component tape magazine arranged for receiving and holding said tape guides) and for loading of the component tape magazine into a component mounting machine, said component tape magazine comprising at least one feeding device for feeding said component tapes in position for picking components from the component tapes by said component mounting machine,
- wherein said at least one tape guide comprise(s) tape guide locking elements arranged for self-adjusting engagement with magazine locking elements comprised in the component tape magazine, such that guiding of the carrier tapes is enabled regardless of the thickness of each carrier tape.

20. The arrangement as claimed in claim 19, wherein said self-adjusting engagement is arranged to provide a controlled contact pressure between the component tape magazine and the carrier tape at the picking position regardless of the thickness of the carrier tape.

21. A system for mounting of components provided on component tapes, the component tapes carrying components positioned in sequence on a carrier tape and covered by a cover, the system comprising:
- at least one tape guide arranged for guiding said component tapes in the component mounting machine, and
- a component mounting machine arranged for receiving and holding said tape guide(s) and for picking said components from the component tapes, said component mounting machine comprising at least one feeding device for feeding said component tapes in position for picking components,
- wherein said at least one tape guide comprise(s) tape guide locking elements arranged for self-adjusting engagement with locking elements comprised in the component mounting machine, such that guiding of the carrier tapes is enabled regardless of the thickness of each carrier type.

22. The system as claimed in claim 21, wherein said self-adjusting engagement is arranged to provide a controlled contact pressure between the component mounting machine and the carrier tape at the picking position regardless of the thickness of the carrier tape.

* * * * *

UNITED STATES PATENT AND TRADEMARK OFFICE
CERTIFICATE OF CORRECTION

| | | |
|---|---|---|
| PATENT NO. | : 6,948,541 B2 | Page 1 of 1 |
| APPLICATION NO. | : 10/884940 | |
| DATED | : September 27, 2005 | |
| INVENTOR(S) | : Johan Bergstrom et al. | |

It is certified that error appears in the above-identified patent and that said Letters Patent is hereby corrected as shown below:

Col. 14, in Claim 3, line 7, please replace "of the cover tape" to --of the carrier tape--; and Col. 15, in Claim 12, line 7, please replace "of the cover tape" to --of the carrier tape--.**

Signed and Sealed this

Thirty-first Day of March, 2009

JOHN DOLL
*Acting Director of the United States Patent and Trademark Office*

UNITED STATES PATENT AND TRADEMARK OFFICE
CERTIFICATE OF CORRECTION

PATENT NO. : 6,948,541 B2  Page 1 of 1
APPLICATION NO. : 10/884940
DATED : September 27, 2005
INVENTOR(S) : Johan Bergstrom et al.

It is certified that error appears in the above-identified patent and that said Letters Patent is hereby corrected as shown below:

Col. 14, in Claim 3, line 41, please replace "of the cover tape" to --of the carrier tape--; and Col. 15, in Claim 12, line 41, please replace "of the cover tape" to --of the carrier tape--.**

This certificate supersedes the Certificate of Correction issued March 31, 2009.

Signed and Sealed this

Twenty-first Day of April, 2009

JOHN DOLL
*Acting Director of the United States Patent and Trademark Office*